US006815989B2

(12) United States Patent
Seo (10) Patent No.: US 6,815,989 B2
(45) Date of Patent: Nov. 9, 2004

(54) SEQUENTIAL ACTIVATION DELAY LINE CIRCUITS AND METHODS

(75) Inventor: Sung-min Seo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/325,766

(22) Filed: Dec. 19, 2002

(65) Prior Publication Data

US 2003/0197540 A1 Oct. 23, 2003

(30) Foreign Application Priority Data

Apr. 19, 2002 (KR) .................................... 2002-0021680

(51) Int. Cl.[7] ................................................ H03L 7/06
(52) U.S. Cl. ...................................... 327/158; 327/270
(58) Field of Search ................................. 327/158, 153, 327/161, 270, 231, 156, 236

(56) References Cited

U.S. PATENT DOCUMENTS

| 5,844,954 A | * 12/1998 | Casasanta et al. ........... 375/373 |
| 5,880,612 A | 3/1999 | Kim ........................... 327/158 |
| 5,901,190 A | 5/1999 | Lee ............................ 327/158 |
| 6,078,199 A | 6/2000 | Kim ........................... 317/116 |
| 6,101,137 A | 8/2000 | Roh ........................... 365/194 |
| 6,222,894 B1 | 4/2001 | Lee ............................ 327/142 |
| 6,285,225 B1 | 9/2001 | Chu et al. ................... 327/158 |
| 6,366,148 B1 | 4/2002 | Kim ........................... 327/262 |
| 6,388,485 B2 | 5/2002 | Kim ........................... 327/161 |
| 6,434,083 B2 | 8/2002 | Lim ........................... 327/147 |
| 6,448,756 B1 | * 9/2002 | Loughmiller ............... 327/158 |
| 6,452,432 B2 | 9/2002 | Kim ........................... 327/158 |
| 6,459,314 B2 | 10/2002 | Kim ........................... 327/161 |
| 6,586,979 B2 | * 7/2003 | Gomm et al. ............... 327/161 |
| 6,597,753 B1 | 7/2003 | Okayasu et al. ............ 375/373 |

FOREIGN PATENT DOCUMENTS

| DE | 44 22 784 C2 | 5/1999 |
| DE | 100 16 853 A1 | 3/2001 |
| DE | 100 60 911 A1 | 6/2002 |
| WO | WO 96/00965 A1 | 1/1996 |

OTHER PUBLICATIONS

Office Action, DE 103 11 823.3–42, Nov. 6, 2003.

* cited by examiner

*Primary Examiner*—Dinh T. Le
(74) *Attorney, Agent, or Firm*—Myers Bigel Sibley & Sajovec (57) ABSTRACT

Delay line circuits and methods include a series of unit delay cells, a respective one of which includes an input and an output that are sequentially connected such that an output of a preceding unit delay cell is connected to an input of a succeeding unit delay cell. At least two of the unit delay cells in the series are sequentially activated in response to an activation signal. The sequential activation may be performed by a control circuit that is connected to the series of unit delay cells.

7 Claims, 4 Drawing Sheets

SEQUENTIAL ACTIVATION DELAY LINE CIRCUITS AND METHODS

RELATED APPLICATION

This application claims the benefit of Korean Patent Application No. 2002-21680, filed Apr. 19, 2002, the disclosure of which is hereby incorporated herein by reference in its entirety as if set forth fully herein.

FIELD OF THE INVENTION

The present invention relates to the field of delay line circuits such as Delay Locked Loops (DLLs), and more particularly, to delay line control circuits and methods for DLLs.

BACKGROUND OF THE INVENTION

In integrated circuit chip Dynamic Random Access Memories (DRAMs), the skew of a clock signal in the integrated circuit chip may affect the operation of the DRAM. A DLL circuit may be used as a compensator for skew of an internal clock signal in a DRAM and/or other integrated circuit chips. The structure and operation of DLLs is well known to those having skill in the art and are described, for example, in U.S. Pat. Nos. 6,459,314; 6,452,432; 6,434,083; 6,388,485; 6,366,148; 6,285,225; 6,222,894; 6,101,137; 5,901,190; and 5,880,612, all of which are assigned to the assignee of the present application.

Unfortunately, a DLL can cause an increase in current consumption in an integrated circuit. Accordingly, in a precharge mode before a DRAM is activated, or in a power-down mode, the DLL is disabled so as to reduce or minimize current consumption of the DLL. In this case, the DLL latches locked phase information in a register, and thus this locked state is maintained.

When the DRAM exits from the precharge mode or power-down mode, all unit delay cells of the DLL selected from locked phase information latched in the register are simultaneously turned on. In this process, a large amount of current may instantaneously flow from an internal supply to a ground voltage of the DLL, and therefore the internal supply voltage of the DLL may become unstable. After all of the selected unit delay cells are simultaneously turned on, the clock signal sequentially passes the selected unit delay cells and a time delay occurs.

Figure 1:
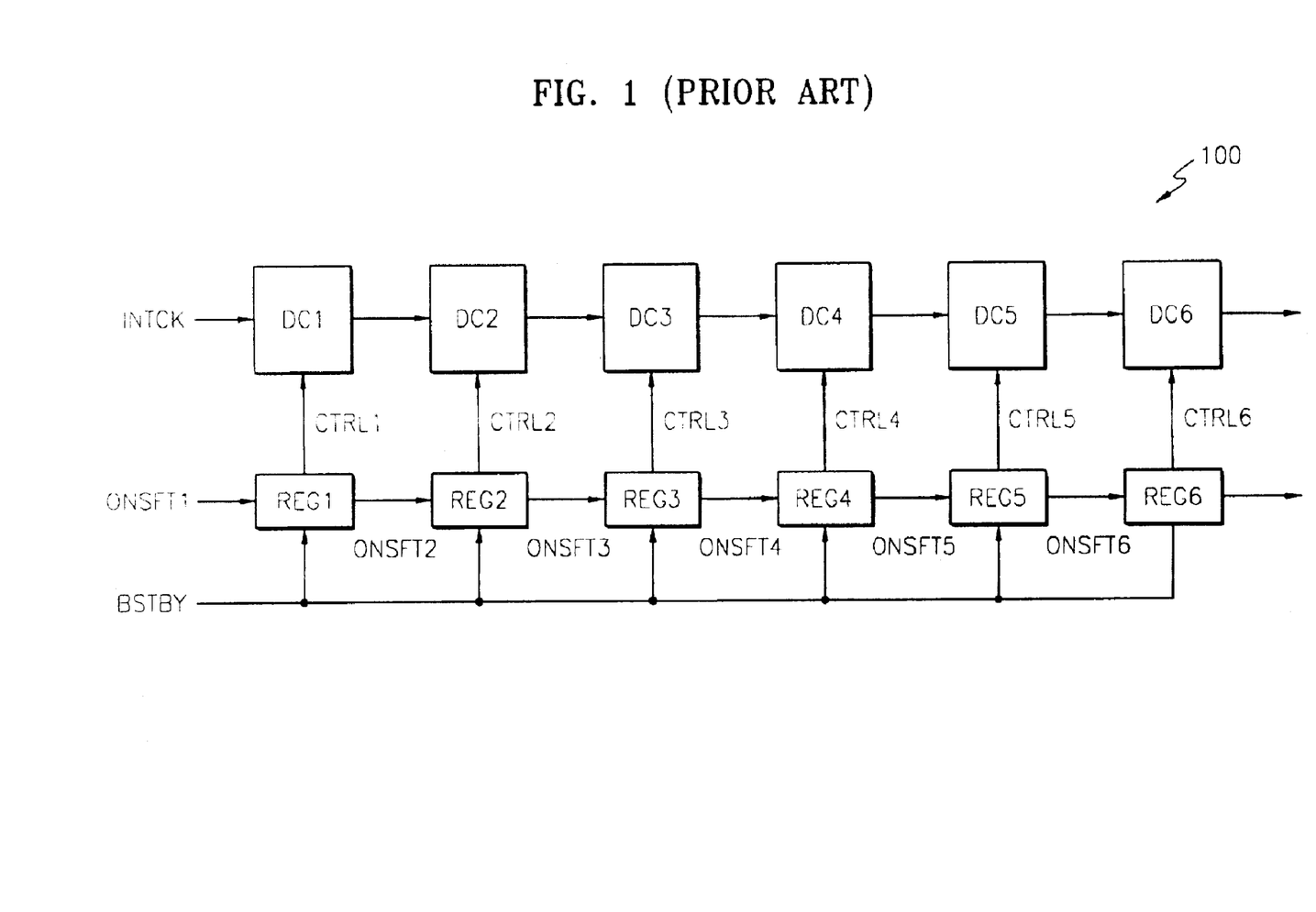
FIG. 1 is a block diagram of a conventional delay line control circuit with a delay locked loop (DLL)
Figure 2:
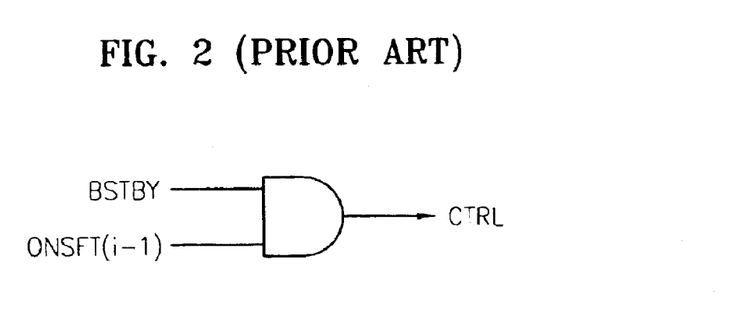
FIG. 2 is a logic diagram of control signals used to control unit delay cells shown in FIG. 1.

FIG. 1 is a block diagram of a conventional delay line control circuit with a delay locked loop (DLL). FIG. 2 is a logic diagram of control signals used to control unit delay cells shown in FIG. 1.

Referring to FIG. 1, the conventional delay line control circuit 100 with a DLL includes first through sixth unit delay cells DC1, DC2, . . . , and DC6 and first through sixth registers REG1, REG2, . . . , and REG6, each of which receives an inverted signal BSTBY of a standby signal, and first through sixth shift turn-on signals ONSFT1, ONSFT2, . . . , and ONSFT6 and generates first through sixth control signals CTRL1, CTRL2, . . . , and CTRL6, respectively, used to control the first through sixth unit delay cells DC1, DC2, . . . , and DC6. It will be understood that even though only six of the unit delay cells DC1, DC2, . . . , and DC6 and/or six of the registers REG1, REG2, . . . , and REG6 are shown in FIG. 1, a different number of unit delay cells and/or registers can be used.

Referring to FIG. 2, a control signal CTRL that is used to control unit delay cells DCs is generated in response to an inverted signal BSTBY of a standby signal and a shift turn-on signal ONSFT(i−1) stored in a register REG before the DLL is locked. It is seen from FIG. 2 that the control signal CTRL is activated only if the inverted signal BSTBY of the standby signal and the shift turn-on signal ONSFT (i−1) are activated.

The operation of the conventional delay line control circuit 100 with the DLL will be described with reference to FIGS. 1 and 2.

In a precharge mode or power-down mode, the standby signal STBY is at a high level and an inverted signal BSTBY of the standby signal STBY is at a low level. Thus, the first through sixth control signals CTRL1, CTRL2, . . . , and CTRL6 of the first through sixth registers REG1, REG2, . . . , and REG6 are generated at low levels. Hence, all of the first through sixth unit delay cells DC1, DC2, . . . , and DC6 are turned off. However, phase information of the first through sixth unit delay cells DC1, DC2, . . . , and DC6 before the DRAM enters the precharge mode or power-down mode are stored in the first through sixth registers REG1, REG2, . . . , and REG6. When the DRAM exits from the precharge mode or power-down mode, the standby signal STBY is at a low level, and the inverted signal BSTBY of the standby signal STBY is at a high level. Since the shift turn-on signal ONSFT(i−1) stored in the first through sixth registers REG1, REG2, . . . , and REG6 is at a high level, the first through sixth control signals CTRL1, CTRL2, . . . , and CTRL6 are at high levels, and therefore the first through sixth unit delay cells DC1, DC2, . . . , and DC6 are activated.

Assuming the first through third unit delay cells DC1, DC2, and DC3 are activated before the DRAM enters the precharge mode or power-down mode in FIG. 1, if the DRAM exits from the precharge mode or power-down mode, the first through third control signals CTRL1, CTRL2, and CTRL3 generated by the first through third registers REG1, REG2, and REG3 are at high levels, and therefore the first through third unit delay cells DC1, DC2, and DC3 are simultaneously turned on. If the first through third unit delay cells DC1, DC2, and DC3 are selected, an internal clock signal INTCK is sequentially transferred to the first through third unit delay cells DC1, DC2, and DC3.

Figure 3:
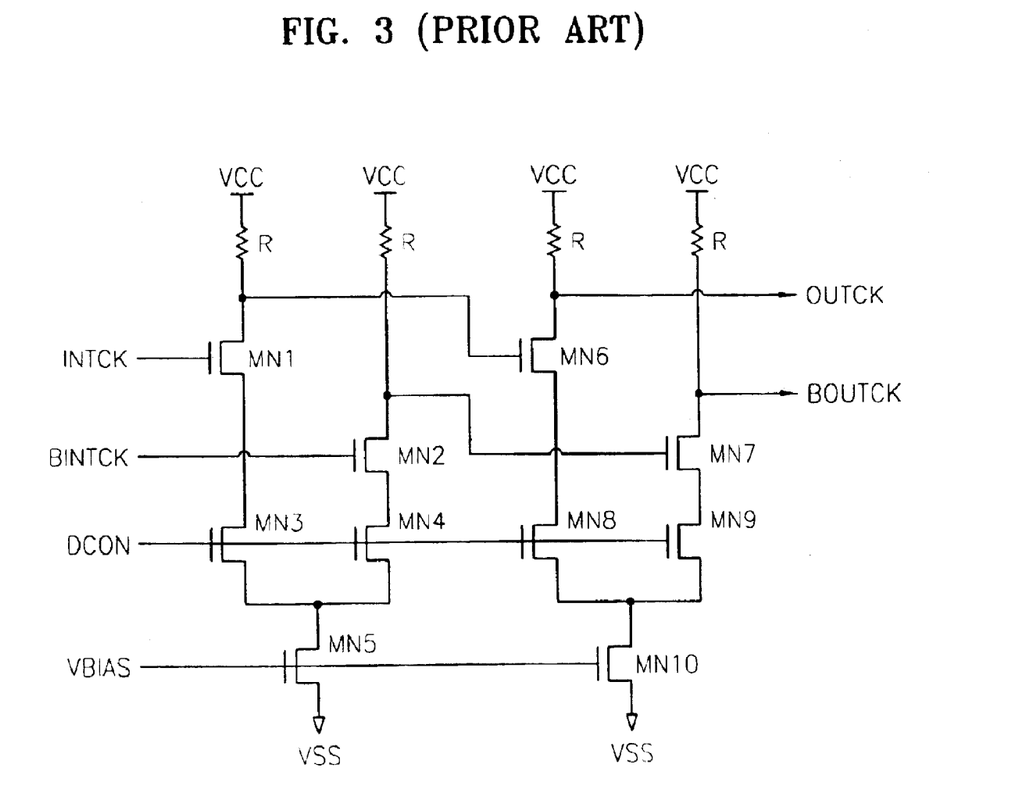
FIG. 3 illustrates an internal circuit of a unit delay cell shown in FIG. 1.

FIG. 3 illustrates an internal circuit of the unit delay cell shown in FIG. 1. Referring to FIG. 3, the unit delay cell includes resistors R connected to supply voltages VCC and first through tenth NMOS transistors MN1, MN2, . . . , MN9, and MN10.

In operation of the internal circuit, the fifth NMOS transistor MN5 and the tenth NMOS transistor MN10 are turned on in response to a high level of a bias signal VBIAS. If a unit delay cell turn-on signal DCON is applied at a high level, the third NMOS transistor MN3, the fourth NMOS transistor MN4, the eighth NMOS transistor MN8, and the ninth NMOS transistor MN9 are turned on. If the internal clock signal INTCK is applied at a high level, the first NMOS transistor MN1 is turned on, the supply voltage VCC is applied to the sixth NMOS transistor MN6, and the high level of the supply voltage VCC is output as an output signal OUTCK. If the internal clock signal INTCK is at a high level, an inverted signal BINTCK of the internal clock signal INTCK is naturally at a low level, and thus the second NMOS transistor MN2 and the seventh NMOS transistor MN7 are turned off.

If the DRAM exits from the precharge mode or power-down mode and the first through third unit delay cells DC1, DC2, and DC3 are simultaneously turned on, the internal clock signal INTCK should pass through the previous first and second unit delay cells DC1 and DC2 so that the internal clock signal INTCK is transferred to the third unit delay cell DC3. Thus, a time delay occurs, and the first through third unit delay cells DC1, DC2, and DC3 are simultaneously turned on, and current consumption is instantaneously increased in the unit delay cells. Hence, the internal supply voltage of the DLL may be unstable. This can be seen from FIG. 3. If the internal supply voltage of the DLL is unstable, the delay time of the unit delay cells may vary. This may affect a data output time, and further may negatively affect jitter characteristics.

SUMMARY OF THE INVENTION

Delay line circuits and controlling methods according to some embodiments of the present invention include a series of unit delay cells, a respective one of which includes an input and an output that are sequentially connected such that an output of a preceding unit delay cell is connected to an input of a succeeding unit delay cell. At least two of the unit delay cells in the series are sequentially activated in response to an activation signal. The sequential activation may be performed by a control circuit that is connected to the series of unit delay cells.

In some embodiments, a respective one of the unit delay cells also includes a respective control input. The control circuit includes a series of control signal generators, a respective one of which includes first and second inputs and first and second outputs that are sequentially connected, such that a respective first output is connected to a respective control input, the first output of a preceding control signal generator is connected to the first input of a succeeding control signal generator, and the second input of a succeeding control generator is connected to the second output of a preceding control signal generator. The activation signal is connected to the first input of a first control signal generator in the series of control signal generators. Accordingly, some embodiments of the present invention can reduce or prevent the instantaneous flow of a large amount of current through the series of unit delay cells. Some embodiments may be used in a DRAM when the standby state of the DRAM is converted into an active state. Jitter thereby may be reduced or minimized.

Delay line circuits according to other embodiments of the invention include a delay line portion and a control portion. The delay line portion has first through N-th, where N is an integer, unit delay cells, at least some of which receive an output of the previous unit delay cell, delay the output for a predetermined amount of time and output a delayed value, wherein an internal clock signal is input to the first unit delay cell. The control portion is configured to generate first through N-th control signals used to activate and deactivate the first through N-th unit delay cells in response to a predetermined activation signal. The first through N-th unit delay cells are sequentially activated in response to the activation signal. The control portion includes first through N-th control signal generating portions, a respective one of which corresponds to a respective one of the first through N-th unit delay cells and that is configured to generate the first through N-th control signals in response to predetermined first through N-th input signals, and first through N-th shift turn-on signals.

In some embodiments, the first input signal is the activation signal, and the second through N-th input signals that are input to the second through N-th control signal generating portions are control signals generated by the previous first through N-th control signal generating portions.

In some embodiments, the first control signal generating portion is turned on or off in response to the first shift turn-on signal, and each of the second through N-th control signal generating portions is turned on or off in response to the second through N-th shift turn-on signals output from the previous first through N-th control signal generating portions.

In some embodiments, the first through N-th control signals are activated when the corresponding shift turn-on signals and the corresponding control signals are activated.

In other embodiments, the delay line circuit includes first through N-th delay portions. The first delay portion generates a first delay signal in which an internal clock signal is delayed for a predetermined amount of time, and a second shift tun-on signal in response to a predetermined first shift turn-on signal and a predetermined first input signal. The second delay portion generates a second delay signal in which the first delay signal is delayed for a predetermined amount of time, and a third shift turn-on signal in response to the second shift turn-on signal and a predetermined second input signal. The N-th delay portion generates an N-th delay signal in which an (N−1)-th, where N is an integer more than 3, delay signal is delayed for a predetermined amount of time, and an (N+1)-th shift turn-on signal in response to an N-th shift turn-on signal, and a predetermined N-th input signal. The first through N-th delay portions are sequentially activated.

In some embodiments, each of the first through N-th delay portions includes a control signal generating portion which generates a control signal used to activate and deactivate a unit delay cell in response to the corresponding input signal and the shift turn-on signal, and a unit delay cell which delays an input signal for a predetermined amount of time in response to the control signal and outputs the input signal as the delay signal. The first control signal generating portion of the first delay portion is turned on or off in response to the first shift turn-on signal, and each of the second through N-th control signal generating portions of the second through N-th delay portions is turned on or off in response to the first through N-th shift turn-on signals that are output from the previous first through N-th control signal generating portions. In some embodiments, the first through N-th control signals of the first through N-th delay portions are activated when the corresponding shift turn-on signals and the corresponding control signals are activated.

In some embodiments, in the first delay portion, the internal clock signal is input to the unit delay cell, and the first input signal is an operation activation signal indicating that the operation of a delay line circuit is activated. In each of the second through N-th delay portions, each of control signals generated by the control signal generating portion of the previous delay portion is received as the second through N-th input signals, and the delay signal generated in the unit delay cell of the previous delay portion is input to the unit delay cell. The first through N-th control signal generating portions comprise registers.

In delay line circuits and controlling methods according to embodiments of the present invention, unit delay cells are sequentially turned on in response to an activation signal, such as when a standby state of the DRAM is converted into an active state. Upon activation, instantaneous flowing of a large amount of current through the DLL can be reduced or prevented and jitter of the DLL can be reduced or minimized.

DETAILED DESCRIPTION OF PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 4:
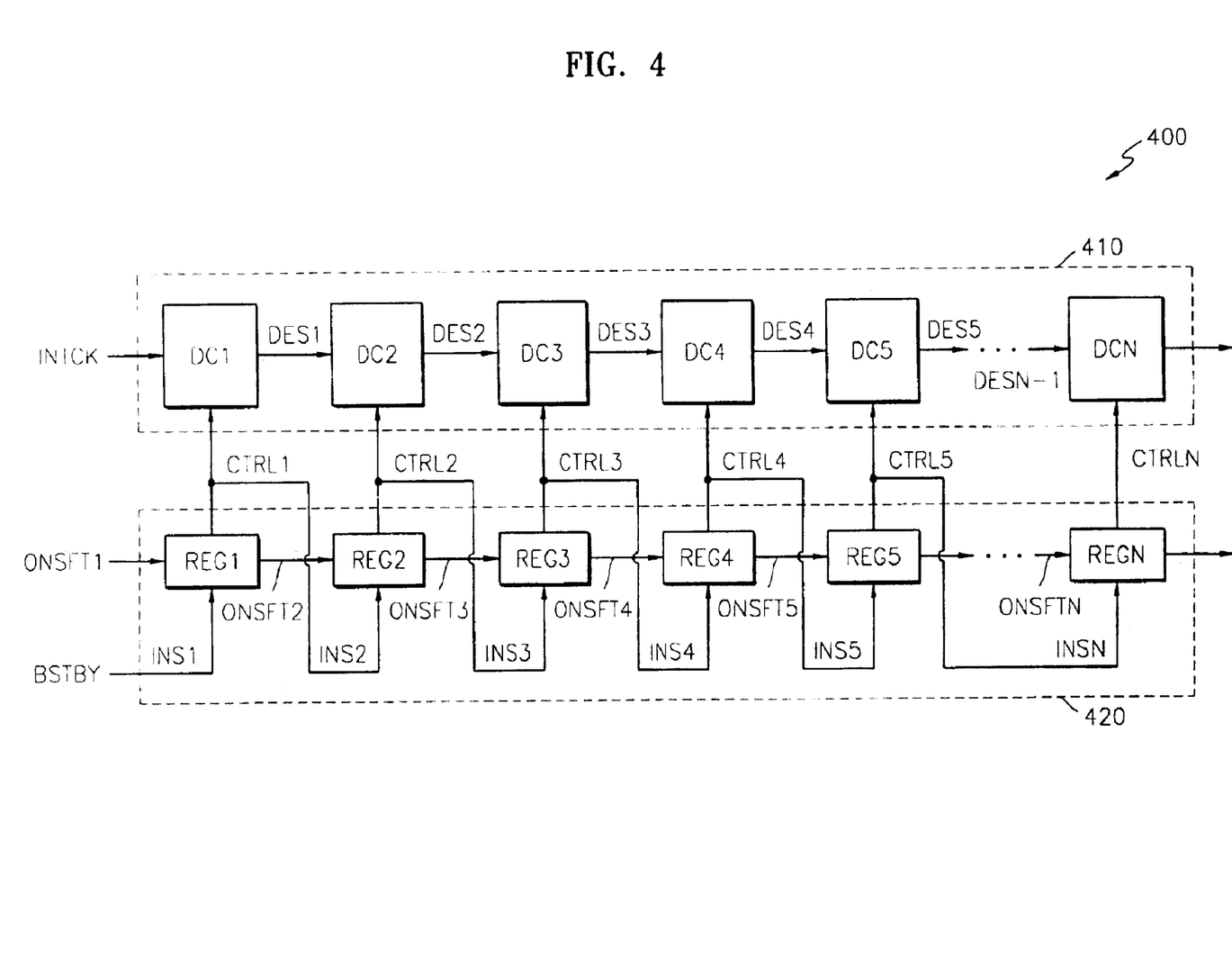
FIG. 4 is a block diagram of delay line circuits and control methods according to embodiments of the present invention.

FIG. 4 is a block diagram of a delay line circuit according to some embodiments of the present invention. Referring to FIG. 4, a delay line circuit 400 according to some embodiments of the present invention includes a delay line portion 410 and a control portion 420.

The delay line portion 410 includes a series, for example, first through N-th (where N is an integer) unit delay cells DC1, DC2, . . . , and DCN. A respective one of the delay cells includes an input and an output that are sequentially connected, such that an output of a preceding unit cell is connected to an input of a succeeding delay cell. More specifically, in some embodiments, each of the unit delay cells DC1, DC2, . . . , and DCN receives outputs at the previous terminal, delays the output for a predetermined amount of time and outputs a delayed value. An internal clock signal INTCK is input to the first unit delay cell DC1.

The first through N-th unit delay cells DC1, DC2, . . . , and DCN are sequentially activated in response to an activation signal BSTBY.

The control portion 420 is connected to the series of unit delay cells, and is configured to sequentially activate the unit cells in the series in response to the activation signal. In particular, in some embodiments, the control portion generates first through N-th control signals CTRL1, CTRL2, . . . , and CTRLN that are used to activate and deactivate the first through N-th unit delay cells DC1, DC2, . . . , and DCN in response to the operation activation signal BSTBY.

More specifically, the control portion 420 includes first through N-th control signal generating portions (also referred to as control signal generators) REG 1, REG2, . . . , and REGN, each corresponding to the first through N-th unit delay cells DC1, DC2, . . . , and DCN and generating the first through N-th control signals (also referred to as control inputs) CIRL1, CTRL2, . . . , and CTRLN in response to predetermined first through N-th input signals INS1, INS2, . . . , and INSN (also referred to as first inputs) and first through N-th shift turn-on signals ONSFT1, ONSFT2, . . . , and ONSFTN (also referred to as second inputs).

In some embodiments, the first input signal INS1 is the activation signal BSTBY, and the second through N-th input signals INS2, INS3, . . . , and INSN input to the second through N-th control signal generating portions REG2, REG3, . . . , and REGN are the first through N-th control signals CTRL1, CTRL2, . . . , and CTRLN generated by the first through N-th control signal generating portions REG1, REG2, . . . , and REGN.

Figure 5:
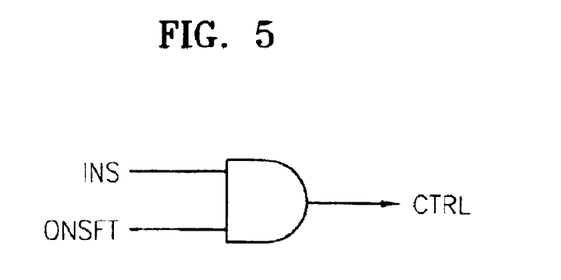
FIG. 5 is a logic diagram of control signals used to control unit delay cells according to embodiments of the present invention.

The first control signal generating portion REG1 is turned on or off in response to the first shift turn-on signal ONSFT1, and the second through N-th control signal generating portions REG2, REG3, . . . , and REGN are turned on or off in response to the first through N-th shift turn-on signals ONSFT1, ONSFT2, . . . , and ONSFTN that are output from the first through N-1 control signal generating portions REG1, REG2, . . . , and REGN-1. See FIG. 5.

The first through N-th control signals CTRL1, CTRL2, . . . , and CTRLN (also referred to as first outputs) are activated when the corresponding first through N-th shift turn-on signals ONSFT1, ONSFT2, . . . , and ONSFTN (also referred to as second outputs) and the corresponding control signals CTRL1, CTRL2,. . . , and CTRLN are activated.

In some embodiments, the first through N-th control signal generating portions REG1, REG2, . . . , and REGN-1 comprise registers.

Hereinafter, operation of the delay line circuit according to some embodiments of the present invention will be described in detail with reference to FIG. 4.

The control portion 420 generates the first through N-th control signals CTRL1, CTRL2, . . . , and CTRLN used to activate and deactivate the first through N-th unit delay cells DC1, DC2, . . . , and DCN in response to the operation activation signal BSTBY.

In some embodiments, the operation activation signal BSTBY may be a standby signal or an inverted signal of the standby signal indicating that the DRAM is in the precharge mode or power-down mode. In embodiments of the present invention shown in FIG. 4, the operation activation signal BSTBY is the inverted signal of the standby signal.

The control portion 420 includes the first through N-th control signal generating portions REG1, REG2, . . . , and REGN, a respective one of which corresponds to a respective one of the first through N-th unit delay cells DC1, DC2, . . . , and DCN and generating the first through N-th control signals CTRL1, CTRL2, . . . , and CTRLN in response to predetermined first through N-th input signals INS1, INS2, . . . , and INSN and first through N-th shift turn-on signals ONSFT1, ONSFT2, . . . , and ONSFTN. The first through N-th control signal generating portions REG1, REG2, . . . , and REGN-1 comprise registers.

The shift turn-on signal ONSFT is used to turn-on or off the operations of the first through N-th control signal generating portions REG1, REG2, . . . , and REGN. That is, when the shift turn-on signal ONSFT is activated, the first through N-th control signal generating portions REG1, REG2, . . . , and REGN can activate the first through N-th control signals CTRL1, CTRL2, . . . , and CTRLN in response to the activation states of the first through N-th input signals INS1, INS2, . . . , and INSN. However, when the shift turn-on signal ONSFT is deactivated, the first through N-th control signal generating portions REG1, REG2, . . . , and REGN cannot activate the first through N-th control signals CTRL1, CTRL2, . . . , and CTRLN even though the first through N-th input signals INS1, INS2, . . . , and INSN are deactivated. The activation state of the shift turn-on signal ONSFT may be at a logic high level or logic low level depending on the configuration of the delay line control circuit. In embodiments of the present invention described herein, a logic high level is referred to as an activation state of the shift turn-on signal ONSFT.

The control signal CTRL is activated when the shift turn-on signal ONSFT and the input signal INS are activated. If only the first through third unit delay cells DC1, DC2, and DC3 are activated and operate before the DRAM enters the precharge mode or power-down mode, the operation of the delay line portion 410 stops, but the first through third control signal generating portions REG1, REG2, and REG3 memorize the first through third shift turn-on signals ONSFT1, ONSFT2, and ONSFT3 having high levels after the DRAM enters the precharge mode or power-down mode.

When the DRAM exits from the precharge mode or power-down mode, the standby signal is generated at a low level, and thus the operation activation signal BSTBY, which is the inverted signal of the standby signal, is generated at a high level. The operation activation signal BSTBY is applied as the first input signal INS1 to the first control signal generating portion REG1. Since the first shift turn-on signal ONSFT1 and the first input signal INS1 are at high levels, the first control signal generating portion REG1 applies the first control signal CTRL1 in an activation state of a high level to the first unit delay cell DC1. Hence, the first unit delay cell DC1 operates.

The first control signal CTRL1 generated at a high level is applied as the second input signal INS2 to the second control signal generating portion REG2. Then, the second control signal generating portion REG2 generates the second control signal CTRL2 at a high level in response to the second shift turn-on signal ONSFT2 having a high level and the second input signal INS2 having a high level, and then applies the second control signal CTRL2 to the second unit delay cell DC2.

In this way, the third unit delay cell D3 is activated in response to the third control signal CTRL3 having a high level.

Each operation of the second through N-th control signal generating portions REG2, . . . , and REGN, other than the first control signal generating portion REG1 is determined through the control signal CTRL generated by the control signal generating portion REG at the previous terminal. The activation of the unit delay cell DC at the present (succeeding) terminal is determined through the control signal CTRL at the previous (preceding) terminal. In addition, the activation of the unit delay cell DC at the next (succeeding) terminal is determined through the control signal at the present (preceding) terminal. Thus, the first through N-th unit delay cells DC1, DC2, . . . , and DCN are sequentially activated such that instantaneous current consumption can be reduced and instability of the internal supply voltage of the DLL can be reduced or minimized. When the DRAM exits from the precharge mode or power-down mode, distortion of the internal clock signal INTCK output from the DLL can be reduced or minimized.

In some embodiments, the first through (N−1)-th control signals CTRL1, CTRL2, . . . , and CTRLN−1 are used as the second through N-th input signals INS2, INS3, . . . , and INSN. However, the inverted signals of the first through N-th control signals CTRL1, CTRL2, . . . , and CTRLN−1 also may be used as the second through N-th input signals INS2, INS3, . . . , and INSN depending on the configuration of the delay line control circuit.

In addition, the delay line control circuit according to some embodiments of the present invention may include fourth through N-th delay portions as follows.

The first delay portion generates a first delay signal DES1 in which an internal clock signal INTCK is delayed for a predetermined amount of time and a second shift turn-on signal ONSFT2 in response to the internal clock signal INTCK, a predetermined first shift turn-on signal ONSFT1 and a predetermined first input signal INS1.

The second delay portion generates a second delay signal DES2 in which the first delay signal DES1 is delayed for a predetermined amount of time and a third shift turn-on signal ONSFT3 in response to the first delay signal DES1, the second shift turn-on signal ONSFT2, and a predetermined second input signal INS2.

The N-th delay portion generates a N-th delay signal DESN in which a (N−1)-th (where, N is an integer greater than 3) delay signal DESN-1 is delayed for a predetermined amount of time and an (N+1)-th shift turn-on signal ONSFTN+1 in response to the (N−1)-th delay signal DESN-1, a N-th shift turn-on signal ONSFTN, and a predetermined N-th input signal INSN. The first through N-th delay portions are sequentially activated.

The first through N-th delay portions include a control signal generating portion REG which generates a control signal CTRL used to activate and deactivate a unit delay cell DC in response to the corresponding input signal INS and the corresponding shift turn-on signal ONSFT. The first through N-th delay portions further include the unit delay cell DC which delays an input signal for a predetermined amount of time in response to the control signal CTRL and outputs the input signal as a delay signal DES.

The first control signal generating portion REG1 of the first delay portion is turned on or off in response to the first shift turn-on signal ONSFT1. The second through N-th control signal generating portions REG2, REG3, . . . , and REGN of the second through N-th delay portions are turned on or off in response to shift turn-on signals ONSFTs output from the previous first through (N−1)-th control signal generating portions REG1, REG2, . . . , and REGN−1.

The first through N-th control signals CTRL1, CTRL2, . . . , and CTRLN of the first through N-th delay portions are activated when the corresponding shift turn-on signals ONSFTs and the corresponding control signals CTRLs are activated.

In the first delay portion, the internal clock signal INTCK is input to the first unit delay cell DC1, and the first input signal INS12 is a predetermined operation activation signal BSTBY. The second through N-th delay portions receive the first through (N−1)-th control signals CTRL1, CTRL2, . . . , and CTRLN−1 generated by the previous first through (N−1)-th control signal generating portions REG1, REG2, . . . , and REGN−1, respectively, and the delay signal generated in the unit delay cell of the previous delay portion is input to the unit delay cells. The first through N-th control signal generating portions REG1, REG2, . . . , and REGN comprise registers.

The above-described embodiments of delay lines correspond to other embodiments shown in FIG. 4, and the operations of elements are the same as those of FIG. 4. Hence, detailed descriptions of operations will be omitted.

As described above, in delay lines according to the present invention, unit delay cells are sequentially turned on, for example when a standby state is converted into an active state, such that instantaneous flowing of a large amount of current through the delay line is reduced or prevented and jitter of the delay line is reduced or minimized.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A delay line circuit comprising:
   a series of unit delay cells, a respective one of which includes an input and an output that are sequentially connected such that an output of a preceding unit delay cell is connected to an input of a succeeding unit delay cell; and
   a control circuit that is connected to the series of unit delay cells and that is configured to sequentially activate at least two of the unit delay cells in the series in response to an activation signal.

2. A delay lime circuit according to claim 1 wherein a respective one of the unit delay cells also includes a respective control input, the control circuit comprising a series of control signal generators, a respective one of which includes first and second inputs and first and second outputs that are sequentially connected such that a respective first output is connected to a respective control input, the first output of a preceding control signal generator is connected to the first input of a succeeding control signal generator and the second input of a succeeding control signal generator is connected to the second output of a preceding control signal generator.

3. A delay line circuit according to claim 2 wherein the activation signal is connected to the first input of a first control signal generator in the series of control signal generators.

4. A delay line circuit according to claim 3 wherein a respective control signal generator comprises a respective logic circuit and a respective register.

5. A method of controlling a delay line that includes a series of unit delay cells, a respective one of which includes an input and an output that are sequentially connected such that an output of a preceding unit delay cell is connected to an input of a succeeding unit delay cell, the method comprising:
   sequentially activating at least two of the unit delay cells in the series in response to an activation signal.

6. A delay line circuit comprising:
   a series of unit delay cells, a respective one of which includes an input and an output that are sequentially connected such that an output of a preceding unit delay cell is connected to an input of a succeeding unit delay cell; and
   means for sequentially activating at least two of the unit delay cells in the series in response to an activation signal.

7. A delay line circuit according to claim 6 wherein a respective one of the unit delay cells also includes a respective control input, the means for sequentially activating comprising a series of control signal generators, a respective one of which includes first and second inputs and first and second outputs that are sequentially connected such that a respective first output is connected to a respective control input, the first output of a preceding control signal generator is connected to the first input of a succeeding control signal generator and the second input of a succeeding control signal generator is connected to the second output of a preceding control signal generator.

* * * * *

UNITED STATES PATENT AND TRADEMARK OFFICE
CERTIFICATE OF CORRECTION

PATENT NO. : 6,815,989 B2 Page 1 of 1
DATED : November 9, 2004
INVENTOR(S) : Seo It is certified that error appears in the above-identified patent and that said Letters Patent is hereby corrected as shown below:

Title page,
Item [56], References Cited, U.S. PATENT DOCUMENTS, should include:
-- 2003/0218509  A1    11/2003  Unterricker --

Signed and Sealed this

First Day of March, 2005

JON W. DUDAS
*Director of the United States Patent and Trademark Office*